(12) United States Patent
Ohno et al.

(10) Patent No.: US 6,849,099 B2
(45) Date of Patent: Feb. 1, 2005

(54) POLISHING COMPOSITION

(75) Inventors: Koji Ohno, Gifu (JP); Chiyo Horikawa, Gifu (JP); Kenji Sakai, Aichi (JP); Katsuyoshi Ina, Aichi (JP)

(73) Assignee: Fujimi Incorporated, Aichi (JP)

( * ) Notice: Subject to any disclaimer, the term of this patent is extended or adjusted under 35 U.S.C. 154(b) by 0 days.

(21) Appl. No.: 10/674,318

(22) Filed: Sep. 30, 2003

(65) Prior Publication Data

US 2004/0250476 A1 Dec. 16, 2004

(30) Foreign Application Priority Data

Oct. 1, 2002 (JP) ........................................ 2002-289202

(51) Int. Cl.[7] ............................. C09G 1/02; C09G 1/04; H01L 21/304
(52) U.S. Cl. ............................. 51/308; 106/3; 438/692; 438/693
(58) Field of Search .............................. 51/308; 106/3; 438/692, 693

(56) References Cited

U.S. PATENT DOCUMENTS

| | | | |
|---|---|---|---|
| 5,527,423 A | 6/1996 | Neville et al. | 156/636.1 |
| 5,575,837 A | 11/1996 | Kodama et al. | 106/3 |
| 5,958,288 A | 9/1999 | Mueller et al. | 252/186.1 |
| 6,001,269 A | 12/1999 | Sethuraman et al. | 216/89 |
| 6,083,419 A | 7/2000 | Grumbine et al. | 252/79.1 |
| 6,117,783 A | 9/2000 | Small et al. | 438/693 |
| 6,136,711 A | 10/2000 | Grumbine et al. | 438/692 |
| 6,313,039 B1 | 11/2001 | Small et al. | 438/693 |
| 2003/0084815 A1 | 5/2003 | Ohno et al. | 106/3 |
| 2004/0192049 A1 * | 9/2004 | Ohno et al. | 438/693 |

FOREIGN PATENT DOCUMENTS

| | | |
|---|---|---|
| EP | 0 811 665 A2 | 12/1987 |
| WO | 98/04646 | 2/1998 |

* cited by examiner

*Primary Examiner*—Michael Marcheschi
(74) *Attorney, Agent, or Firm*—Vidas, Arrett & Steinkraus

(57) ABSTRACT

There is provided a polishing composition that reduces erosion and is used in a final polishing step of a semiconductor device manufacturing process. The polishing composition contains colloidal silica, a periodic acid compound, ammonia, ammonium nitrate and water and its pH is 1.8 to 4.0.

15 Claims, 1 Drawing Sheet

POLISHING COMPOSITION

BACKGROUND OF THE INVENTION

The present invention relates to a polishing composition, and more specifically to a polishing composition that is used in, for example, a polishing step for forming wirings of semiconductor device.

In the process of semiconductor device production, a polishing step has been carried out in accordance with CMP (Chemical Mechanical Polishing). In the wiring forming method in accordance with CMP, wiring trenches are formed on an insulation layer and then a metal layer is formed on the insulation layer so that it fills up the wiring trenches completely. The metal layer is then polished and removed so that the top surface of the insulation layer is exposed. Wiring is formed of the metal layer left in the wiring trenches.

Japanese National Phase Laid-Open Patent Publication No. 2000-501771 discloses a prior art polishing composition. The polishing composition is produced by adding ammonium persulfate, potassium periodate and sodium hydroxide to alumina slurry. The alumina slurry mechanically polishes the metal layer and the synergistic action of ammonium persulfate and potassium periodate improves the polishing rate for the conductive layer.

The composition currently in use, however, enhances not only the polishing rate for the conductive layer, but also the polishing rate for the insulation layer. As a result, when using the polishing composition currently in use to carry out final polishing of the metal layer and the insulation layer in the wiring area, the top surface level of the insulation layer in the wiring area becomes lower than that of the insulation layer outside the wiring area, which means creation of local erosion (refer to FIG. 3).

SUMMARY OF THE INVENTION

Accordingly, the object of this invention is to provide a polishing composition used in the polishing step of the process of semiconductor device production which makes it hard to create erosion.

One aspect of the present invention is a polishing composition used in a final polishing step of a manufacturing process of a semiconductor device, wherein the semiconductor device includes an insulation layer having a surface on which trenches are formed, and a conductive layer formed on the insulation layer. The polishing composition contains colloidal silica compounded in said polishing composition in a quantity larger than 50 g/liter and smaller than 160 g/liter, a periodic acid compound, ammonia, ammonium nitrate, and water, and has a pH that is in the range of 1.8 to 4.0.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawing in which.

DETAILED DESCRIPTION OF THE PREFERRED EMBODIMENTS

Figure 1:
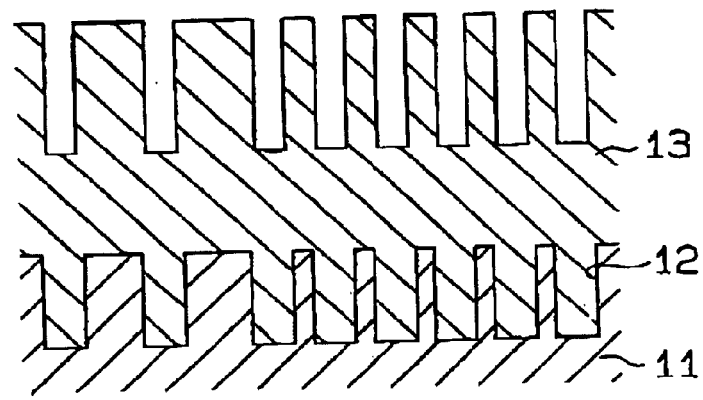
FIG. 1 is a cross-sectional view of a semiconductor device which has been polished with a polishing composition in accordance with one embodiment of this invention.

First, a method of forming wiring of a semiconductor device will be described. As shown in FIG. 1, first an insulation layer 11 is laminated on a semiconductor substrate (not shown). Desirably the top surface of the insulation layer 11 is made as flat as possible. Wiring trenches 12 having a prescribed design pattern are formed on the insulation layer 11 by known lithograph and pattern etching techniques. The insulation layer 11 is, for example, a $SiO_2$ film, such as a TEOS (tetraethoxysilane) film, a BSG film, a PSG film or a BPSG film, a SiOF film, or a SiOC film.

Then, a conductive layer 13, or a metal layer is formed on the insulation layer 11 so that it fills up at least the wiring trenches 12 completely. The conductive layer 13 is formed by, for example, PVD (Physical Vapor Deposition). The conductive layer 13 is formed of a conducting metal such as tungsten (W), ruthenium (Ru), platinum (Pt), gold (Au), hafnium (Hf), cobalt (Co) or nickel (Ni). The conducting metal is preferably W, Ru, Pt or Au, which is capable of improving the conductivity of the conductive layer, more preferably W or Ru, and most preferably W.

Figure 2:
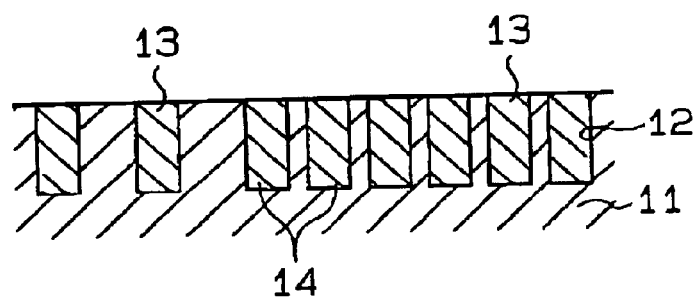
FIG. 2 is a cross-sectional view of a semiconductor device which has been polished with a polishing composition in accordance with one embodiment of this invention.

Then, the conductive layer 13 and the insulation layer 11 are subjected to final polishing until the top surface of the insulation layer 11 is exposed, as shown in FIG. 2. Wiring 14 is formed of the conductive layer 13 with which the wiring trenches 12 have been filled up. One embodiment of this invention relates to a polishing composition which is used in the polishing step of subjecting the conductive layer 13 and the insulation layer 11 to final polishing.

The composition in accordance with the embodiment contains the following ingredients:

A: colloidal silica

B: at least one selected from the group consisting of periodic acids and the salts thereof (hereinafter referred to as periodic acid compound)

C: ammonia

D: ammonium nitrate

E: water.

The ingredient A, or colloidal silica, acts to mechanically polish the surface to be polished. Although colloidal silica can be synthesized using various processes, in this embodiment colloidal silica synthesized by sol-gel process is preferably used. Colloidal silica is particularly preferably used which is synthesized in such a manner as to drop methyl silicate into a solvent consisting of methanol, ammonia and water to hydrolyze the same. The colloidal silica thus produced has a characteristic of containing an extremely small amount of impurity elements. When the content of impurity elements does not matter, however, colloidal silica produced by utilizing ion exchange, what is known as colloidal silica by ion-exchange process, may be used.

The preferred particle diameter of colloidal silica will be described. There are two types of particle diameter: average particle diameter $D_1$ calculated based on the specific surface area measured in accordance with a specific surface area measuring method (SET method), which utilizes gas adsorption of powder to measure specific surface; and average particle diameter $D_2$ calculated in accordance with light scattering. The average particle diameter $D_1$ of the colloidal silica is preferably 40 to 120 nm and more preferably 60 to 100 nm. The average particle diameter $D_2$ of the colloidal silica is preferably 80 to 300 nm and more preferably 150 to 250 nm. If the average particle diameter $D_1$ of the colloidal silica is less than 40 nm or the average particle diameter $D_2$ of the same is less than 80 nm, the polishing rate for the conductive layer is lowered. If the average particle diameter $D_1$ of the colloidal silica is more than 120 nm or the average particle diameter $D_2$ of the same is more than 300 nm, the viscosity of the polishing composition becomes too high, which causes deterioration of dispersion stability of the colloidal silica, and hence precipitation and separation of the particles in the polishing composition.

The content of the colloidal silica in one liter of the polishing composition is more than 50 g and not more than 160 g and preferably in the range of 60 to 120 g. If the colloidal silica concentration is 50 g/liter or less, the mechanical polishing performance of the polishing composition is not sufficient, whereas if the colloidal silica concentration is more than 160 g/liter, the viscosity of the polishing composition becomes too high, which causes deterioration of the dispersion stability of the colloidal silica, and hence precipitation and separation of the particles in the polishing composition.

The ingredient B, or a periodic acid compound, acts to chemically polish the conductive layer and the insulation layer and improves the polishing rate for the same. As the periodic acid, orthoperiodic acid ($H_5IO_6$), metaperiodic acid ($HIO_4$), dimesoperiodic acid ($H_4I_2O_9$), mesoperiodic acid ($H_3IO_5$) and diorthoperiodic acid ($H_8I_2O_{11}$) can be used; however, of the above compounds, orthoperiodic acid is preferably used because its composition is stable and it is easy to obtain. As the periodate, all the salts of the above periodic acids can be used; however, ammonium periodate, potassium periodate or sodium periodate is preferably used because they are easy to obtain.

The content of the periodic acid compounds in one liter of the polishing composition is preferably in the range of 4 to 16 g and more preferably in the range of 6 to 12 g. If the periodic acid compound concentration in the polishing composition is less than 4 g/liter, the effect of accelerating the polishing is lowered and the polishing rate for the conductive layer and the insulation layer becomes not sufficient, whereas if the periodic acid compound concentration is more than 16 g/liter, the polishing rate for the conductive layer and the insulation layer becomes too high, which makes it hard to control the polishing operation.

Figure 3:
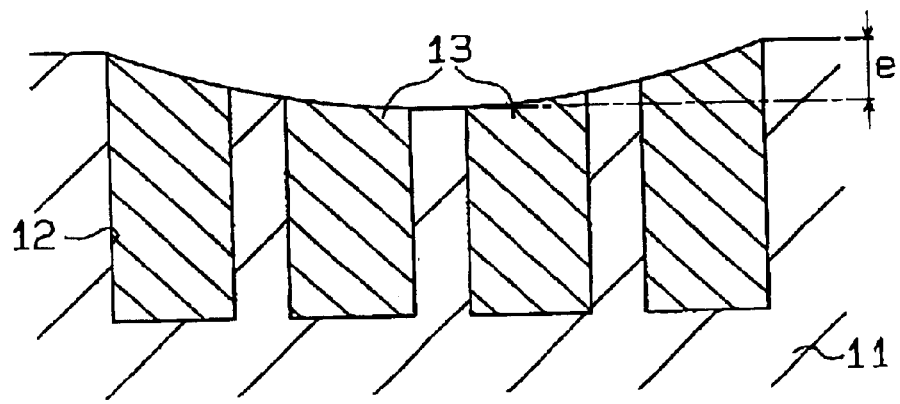
FIG. 3 is an enlarged sectional view showing a portion of a semiconductor device where erosion is created.

The ingredient C, or ammonia, acts as an ingredient for adjusting not only the pH of the polishing composition, but also the polishing rates for the insulation layer and the conductive layer to be almost the same. The higher the ammonia content becomes, the more the polishing rate for the insulation layer is improved. And adjusting the amount of ammonia in the polishing composition decreases the erosion depth e shown in FIG. 3.

The pH of the polishing composition is 1.8 to 4.0 and preferably 2.0 to 3.0. Therefore, ammonia is contained in the polishing composition in amounts that allow the pH of the polishing composition to be kept in the range of 1.8 to 4.0 and preferably in the range of 2.0 to 3.0.

If the pH of the polishing composition is less than 1.8, since the ammonia content is small, the polishing rate for the insulation layer becomes lower than that for the conductive layer. In such a case, the conductive layer is excessively polished compared with the insulation layer. As a result, the level of the conductive layer top surface is lower than that of the insulation layer top surface, which causes the polishing pressure to be concentrated upon the insulation layer top surface, leading to increase in the erosion depth e. Moreover, the polishing composition with pH less than 1.8 might corrode the polishing device, and therefore, such a composition is hard to handle.

On the other hand, if the pH of the polishing composition is more than 4.0, since the ammonia content is large, the dispersion stability of the polishing composition is lowered, which causes separation and gelation of the composition.

The ingredient D, or ammonium nitrate, accelerates the chemical polishing action of the periodic acid compound and hence improves the polishing rate for the conductive layer. The content of ammonium nitrate in one liter of the polishing composition is preferably in the range of 2.5 to 20 g and more preferably in the range of 5 to 15 g. If the ammonium nitrate concentration in the polishing composition is less than 2.5 g/liter, the effect of accelerating the chemical polishing action of the periodic acid compound is lowered, and the polishing rate for the conductive layer cannot be enhanced sufficiently, whereas even if the ammonium nitrate concentration is more than 20 g/liter, the effect of enhancing the chemical polishing action of the periodic acid compounds cannot be obtained any more, and therefore, the polishing composition with ammonium nitrate concentration more than 20 g/liter is uneconomical. Moreover, excessive ammonium nitrate content decreases the stability of the polishing composition, which might cause the separation or gelation of the composition.

The ingredient E, or water, acts as a dispersion medium or a solvent for the ingredients A to D. Water with the least possible impurities that inhibit the action of the ingredients A to D is preferable. Specifically, pure water or ultrapure water, which is obtained by removing impurity ions through an ion-exchange resin and then contaminants through a filter, or distilled water is preferable.

The polishing composition may contain additive ingredients, such as a corrosion inhibitor and an antifoaming agent which are commonly used in polishing compositions, besides the ingredients A to E. The content of additive ingredients in the polishing composition is determined by the usual method adopted in the production of polishing compositions.

Preferably the polishing composition contains the least possible impurities. Specifically, the concentration, in the polishing composition, of each of the elements belonging to the groups II to XII in the periodic table and the elements of aluminum, gallium, indium, thallium, tin, lead and bismuth is preferably 100 ppb or less and more preferably 50 ppb or less. The concentrations of copper, iron, nickel, chromium and manganese are preferably 100 ppb or less, because they are apt to diffuse in the insulation layer ($SiO_2$ film) and affect the yield of semiconductor devices.

The group numbers are in accordance with the notation of a revised edition (1989) of IUPAC Inorganic Chemistry Nomenclature. The concentrations of impurities are measured with an inductively coupled plasma mass spectrometer (ICP-MS), an inductively coupled plasma-atomic emission spectroscope (ICP-AES), an atomic adsorption spectrometer or a total reflection X-ray fluorescence spectroscope (TXRF).

The polishing composition is prepared in such a manner as to add the ingredients A, B, C and D to water and disperse or agitate the mixed solution with a propeller type stirrer or an ultrasonic disperser. The order of adding the ingredients A, B, C and D to water is not limited.

Then, a method of forming the wiring 14 will be described.

The conductive layer 13 and the insulation layer 11 are subjected to final polishing with the polishing composition of this embodiment until the top surface of the insulation layer 11 is exposed (the state shown in FIG. 2). The polishing rate for the conductive layer is preferably 100 to 300 nm/min and more preferably 150 to 250 nm/min. If the polishing rate is less than 100 nm/min, the polishing operation might be prolonged, whereas if the polishing rate is more than 300 nm/min, it is hard to control.

Preferably the polishing rate for the conductive layer and that for the insulation layer are almost the same; specifically, the ratio of the polishing rate for the conductive layer to that for the insulation layer is preferably 1:0.6 to 1:1.3 and more preferably 1:0.7 to 1:1.1. If the ratio is 1: less than 0.6, when the conductive layer and the insulation layer are polished at the same time, the conductive layer is excessively polished compared with the insulation layer and the level of the conductive layer top surface is likely to be lower than that of the insulation layer top surface. In such a case, the polishing pressure tends to be concentrated upon the surface of the insulation layer, which results in increase in the erosion depth e. On the other hand, if the ratio is 1: more than 1.3, the insulation layer is polished in preference to the conductive layer, which might deteriorate the flatness of the surface to be polished.

Due to the synergism of the mechanical polishing action of the colloidal silica and the chemical polishing action of the periodic acid compound and the pH of the polishing composition adjusted to 1.8 to 4.0 with ammonia, the polishing rate for the insulation layer and that for the conductive layer become almost the same. This means well-balanced improvement of the polishing rate for the insulation layer and that for the conductive layer, and hence less erosion depth e, which results in improvement in the flatness of the face to be polished.

When the conductive layer is made up of, for example, tungsten, the surface of the tungsten layer is oxidized by the periodic acid compound and changed into tungsten trioxide. Since tungsten trioxide is brittle, it is easily removed by the mechanical polishing action of the colloidal silica.

According to one embodiment of this invention, the following advantages are obtained.

The polishing composition includes colloidal silica, a periodic acid compound, ammonia, ammonium nitrate and water and its pH is 1.8 to 4.0. Due to the synergistic action of the colloidal silica, the periodic acid compound and ammonia and the pH of the polishing composition adjusted in a proper range, the erosion depth e is decreased.

Due to the colloidal silica and the periodic acid compound, both the polishing rate for the conductive layer and that for the insulation layer are improved.

Since the concentration of the colloidal silica in the polishing composition is 50 g/liter to 160 g/liter, the polishing rate for the conductive layer and that for the insulation layer are relatively high, in addition, almost the same.

When the concentration of each of the elements belonging to the groups II to XII in the periodic table and the elements of aluminum, gallium, indium, thallium, tin, lead and bismuth is 100 ppb or less (parts by mass), the surface defects caused by these impurity elements are inhibited, and the electrical properties of semiconductor devices are inhibited from deteriorating. Further, the surface cleaning with dilute hydrofluoric acid, which is required after using the polishing composition currently in use, can be omitted or shortened, which reduces the production costs of the wiring 14.

Since the polishing rate for the insulation layer 11 is 0.6 to 1.3 when the polishing rate for the conductive layer 13 is 1, the erosion which is produced when the polishing of the conductive layer 13 and the insulation layer 11 is carried out at the same time is decreased.

The embodiment may be modified as follows.

When the thickness of the conductive layer 13 is, for example, 300 nm or more, the layer 13 is removed to the thickness of 200 nm or less and preferably 100 nm or less (first polishing). Then, the conductive layer 13 and the insulation layer 11 are polished with the polishing composition of this invention until the top surface of the insulation layer 11 is exposed (second polishing). The wiring 14 may also be formed in the wiring trenches 12 in this manner.

After forming the wiring trenches 12, a front-end layer made up of titanium or titanium nitride may be formed on the insulation layer 11. When forming the front-end layer, the conductive layer 13 is formed so that the wiring trenches 12 coated with the front-end layer are filled up completely and the metal layer is made up of the front-end layer and the conductive layer 13. In such a case, the front-end layer improves the adhesion between the conductive layer 13 and the insulation layer 11; as a result, the wiring 14 is prevented from peeling off.

The polishing composition may be prepared in a concentrated state so that it is diluted with water in an amount that makes up for its shortage. The polishing composition in a concentrated state is easy to store and transport.

The polishing composition may be prepared in such a state that a first agent including colloidal silica and water and a second agent including a periodic acid compound, ammonia, ammonium nitrate and water are separated from each other. In such a case, the first and the second agents are mixed when the composition is used in polishing.

In the following examples and comparative examples of this invention will be described.

EXAMPLES 1 TO 15 AND COMPARATIVE EXAMPLES 1 to 7

In example 1, colloidal silica (A) synthesized by sol-gel process, orthoperiodic acid (B), ammonium nitrate (D) and water were mixed. The pH of the mixture was adjusted using 28 wt % aqueous ammonia (C) to prepare a polishing composition of example 1. The content of each ingredient in the composition and the pH of the composition are given in Table 1.

The average particle diameter of the colloidal silica calculated from the specific surface area, which was determined by BET method, and the particle density was 90 mm The average particle diameter of the same determined by light scattering was 250 nm. The determination of the specific surface area of the colloidal silica was made using FlowSorb II2300 (manufactured by Micromeritics). The determination of the average particle diameter by light scattering was made using N4 Plus Submicron Particle Sizer (manufactured by Beckman Coulter, Inc.).

The polishing compositions of examples 2 to 15 and comparative examples 1 to 7 were prepared in the same manner as that of example 1, except that the contents of the ingredients and the pH of the compositions were changed. In Table 1, the contents of the colloidal silica, the periodic acid compound and the ammonium nitrate were given in g/liter.

In comparative example 6, fumed silica was used instead of the colloidal silica (A). The average particle diameter of the fumed silica calculated from the specific surface area, which was determined by BET method, and the particle density was 30 nm. The average particle diameter of the same determined by light scattering was 100 nm.

In comparative example 7, fumed alumina was used instead of the colloidal silica (A). The average particle diameter of the fumed alumina calculated from the specific surface area, which was determined by BET method, and the particle density was 30 nm. The average particle diameter of the same determined by light scattering was 100 nm.

(1) Determination of Polishing Rate

Tungsten wafers and SiO$_2$ wafers were polished for 1 minute with the polishing compositions of examples 1 to 15 and comparative examples 1 to 7 under the following conditions:

Polishing machine: single side CMP polishing machine (Mirra; manufactured by Applied Materials)
Polishing pad: polyurethane laminate polishing pad (IC-1000/Suba 400; manufactured by Rodel)
Polishing pressure: 4 psi (about 28 kPa)
Turn table revolution: 60 rpm
Polishing composition supplying rate: 150 ml/min
Carrier revolution: 60 rpm.

The thickness of each wafer before and after the polishing process was measured with a resistance meter (VR-120; manufactured by Kokusai Electric System Service Co., Ltd.) and the polishing rates for each tungsten wafer and for each SiO$_2$ wafer were calculated in accordance with the following equation.

Polishing rate [nm/min]=(thickness of wafer before polishing [nm]–thickness of wafer after polishing [nm])÷polishing time [min]

The ratio of the polishing rates (polishing rate for tungsten wafer/polishing rate for SiO$_2$ wafer) was also calculated for each case.

(2) Determination of Erosion Depth

Wafers including: an insulation layer on which a wiring trench pattern was formed; and a tungsten layer formed on the insulation layer to have thickness of 500 nm were polished with pre-polishing composition so that the thickness of the tungsten layer became 200 nm. The pre-polishing composition had the same composition as that of the polishing composition of comparative example 6, except that the concentration of orthoperiodic acid was 15 g/liter. Then, the wafers were polished with the polishing compositions of the examples and the comparative examples under the following conditions. The time required for the polishing was the time required to remove the tungsten layer to expose the top surface of the insulation layer, and it was measured with an end point detector. The erosion depth in the wiring area where the area ratio of the tungsten layer top surface to the insulation layer top surface is 50:50 was measured with a contact type profiler (HRP 340; manufactured by KLA-Tencor).

TABLE 1

|  | (A) | (B) | (D) | pH | Polishing rate (Å/min) W | Polishing rate (Å/min) SiO$_2$ | Polishing rate ratio (W/SiO$_2$) | Erosion depth (Å) |
|---|---|---|---|---|---|---|---|---|
| Examples |  |  |  |  |  |  |  |  |
| 1 | 80 | 6 | 10 | 2.2 | 2030 | 2140 | 0.95 | 100 |
| 2 | 100 | 6 | 10 | 2.2 | 2210 | 2270 | 0.97 | 80 |
| 3 | 150 | 6 | 10 | 2.2 | 2200 | 2290 | 0.96 | 50 |
| 4 | 80 | 2 | 10 | 2.2 | 1210 | 1980 | 0.61 | 90 |
| 5 | 80 | 4 | 10 | 2.2 | 1700 | 2050 | 0.83 | 95 |
| 6 | 80 | 8 | 10 | 2.2 | 2240 | 2090 | 1.07 | 110 |
| 7 | 80 | 10 | 10 | 2.2 | 2500 | 2120 | 1.18 | 120 |
| 8 | 80 | 12 | 10 | 2.2 | 2750 | 2120 | 1.30 | 145 |
| 9 | 80 | 6 | 5 | 2.2 | 1970 | 2140 | 0.92 | 120 |
| 10 | 80 | 6 | 15 | 2.2 | 2140 | 2140 | 1.00 | 115 |
| 11 | 80 | 6 | 20 | 2.2 | 2270 | 2140 | 1.06 | 115 |
| 12 | 80 | 6 | 10 | 1.8 | 1950 | 2220 | 0.88 | 90 |
| 13 | 80 | 6 | 10 | 2.0 | 2060 | 2180 | 0.94 | 95 |
| 14 | 80 | 6 | 10 | 3.0 | 2130 | 2120 | 1.00 | 110 |
| 15 | 80 | 6 | 10 | 4.0 | 2220 | 2010 | 1.10 | 120 |
| Comparative Examples |  |  |  |  |  |  |  |  |
| 1 | 80 | 0 | 10 | 4.0 | 20 | 70 | 0.29 | — |
| 2 | 50 | 6 | 10 | 2.2 | 2040 | 1500 | 1.36 | 165 |
| 3 | 80 | 6 | 0 | 2.2 | 1860 | 2140 | 0.87 | 150 |
| 4 | 80 | 6 | 10 | 6.0 | — | — | — | — |
| 5 | 0 | 6 | 10 | 2.2 | 400 | 10 | 40.00 | 550 |
| 6 | 80 | 6 | 10 | 2.2 | 2500 | 70 | 35.71 | 500 |
| 7 | 80 | 6 | 10 | 2.2 | 2800 | 50 | 56.00 | 590 |

As shown in Table 1, the erosion depth was decreased for the polishing compositions of examples 1 to 15.

When using the polishing composition of comparative example 1 which contained no periodic acid compound, the polishing rate for tungsten and SiO$_2$ was lowered and the patterned wafer could not be polished properly.

When using the polishing composition of comparative example 2 in which the content of colloidal silica was 50 b/liter or less, the erosion depth was increased.

When using the polishing composition of comparative example 3 which contained no ammonium nitrate, the erosion depth was increased.

When using the polishing composition of comparative example 4 whose pH was above 4.0, the colloidal silica precipitated because of the unstableness of the polishing composition and the blanket wafer and the patterned wafer could not be polished properly.

When using the polishing composition of comparative example 5 which contained no colloidal silica, the erosion depth was increased.

When using the polishing compositions of comparative examples 6 and 7 which contained fumed silica and fumed alumina, respectively, instead of colloidal silica, the erosion depth was increased.

The present examples and embodiments are to be considered as illustrative and not restrictive, and the invention is not to be limited to the details given herein, but may be modified within the scope and equivalence of the appended claims.

What is claimed is:

1. A polishing composition used in a final polishing step of a manufacturing process of a semiconductor device, wherein the semiconductor device includes an insulation layer having a surface on which trenches are formed, and a conductive layer formed on the insulation layer, the polishing composition comprising:

colloidal silica compounded in said polishing composition in a quantity larger than 50 g/liter and smaller than 160 g/liter;

a periodic acid compound;

ammonia;

ammonium nitrate; and water, wherein the polishing composition has a pH that is in the range of 1.8 to 4.0.

2. The composition according to claim 1, wherein the periodic acid compound is at least one compound selected from the group consisting of orthoperiodic acid, metaperiodic acid, dimesoperiodic acid, mesoperiodic acid, diorthoperiodic acid, ammonium periodate, potassium periodate and sodium periodate.

3. The composition according to claim 1, wherein the periodic acid compound compounded in said polishing composition is in a quantity larger than 6 g/liter and smaller than 12 g/liter.

4. The composition according to claim 1, wherein the ammonium nitrate compounded in said polishing composition is in a quantity larger than 5 g/liter and smaller than 15 g/liter.

5. The composition according to claim 1, wherein the polishing composition contains aluminum, gallium, indium, thallium, tin, lead, bismuth, and each of the elements that belongs to the groups II to XII in the periodic table not more than 100 ppb.

6. The composition according to claim 1, wherein a ratio of polishing rate of the composition for the conductive layer to that for the insulation layer is 1:0.6 to 1:1.3.

7. The composition according to claim 1, wherein the average particle diameter of the colloidal silica, which is calculated based on the specific surface area measured in accordance with a specific surface area measuring method utilizing gas adsorption of powder, is 60 to 100 nm.

8. The composition according to claim 1, wherein the average particle diameter of the colloidal silica calculated in accordance with light scattering is 150 to 250 nm.

9. A method of preparing a polishing composition used in a final polishing step of a manufacturing process of a semiconductor device, wherein the semiconductor device includes an insulation layer having a surface on which trenches are formed, and a conductive layer formed on the insulation layer, the method comprising the steps of:

mixing colloidal silica, a periodic acid compound, ammonium nitrate, and water; and adding ammonia to the mixture to adjust the pH of the mixture to 1.8 to 4.0.

10. The method according to claim 9, wherein the periodic acid compound is at least one compound selected from the group consisting of orthoperiodic acid, metaperiodic acid, dimesoperiodic acid, mesoperiodic acid, diorthoperiodic acid, ammonium periodate, potassium periodate, and sodium periodate.

11. The method according to claim 9, wherein the periodic acid compound compounded in said polishing composition is in a quantity larger than 6 g/liter and smaller than 12 g/liter.

12. The method according to claim 9, wherein the ammonium nitrate compounded in said polishing composition is in a quantity larger than 5 g/liter and smaller than 15 g/liter.

13. The method according to claim 9, wherein the average particle diameter of the colloidal silica, which is calculated based on the specific surface area obtained by measurement in accordance with a specific surface area measuring method utilizing gas adsorption of powder, is 60 to 100 nm.

14. The method according to claim 9, wherein the average particle diameter of the colloidal silica calculated in accordance with light scattering is 150 to 250 nm.

15. A method for polishing a semiconductor device that includes an insulation layer having a surface on which trenches are formed, and a conductive layer formed on the insulation layer, the method comprising:

a first polishing step in which the conductive layer is polished until the thickness of the conductive layer becomes 200 nm or less; and a second polishing step in which the conductive layer and the insulation layer are polished so that the surface of the insulation layer is exposed, wherein the second polishing step includes using a polishing composition that contains:

compounded in said polishing composition in a quantity larger than 50 g/liter and smaller than 160 g/liter;

a periodic acid compound;

ammonia;

ammonium nitrate; and water, wherein the polishing composition has a pH that is in the range of 0.8 to 4.0.

* * * * *